(12) United States Patent
Jung et al.

(10) Patent No.: US 8,674,597 B2
(45) Date of Patent: Mar. 18, 2014

(54) POLARIZER AND ORGANIC LIGHT-EMITTING DISPLAY DEVICE INCLUDING THE SAME

(75) Inventors: Woo-Suk Jung, Yongin (KR); Soon-Ryong Park, Yongin (KR); Duk-Jin Lee, Yongin (KR); Sa-Bang Um, Yongin (KR); Jung-Jun Im, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 993 days.

(21) Appl. No.: 12/769,777

(22) Filed: Apr. 29, 2010

(65) Prior Publication Data

US 2011/0157540 A1    Jun. 30, 2011

(30) Foreign Application Priority Data

Dec. 28, 2009  (KR) .......................... 10-2009-0131799

(51) Int. Cl.
*G02B 27/28*  (2006.01)
(52) U.S. Cl.
USPC .......................................... 313/504; 349/194

(58) Field of Classification Search
None
See application file for complete search history.

(56) References Cited

U.S. PATENT DOCUMENTS

| 7,339,736 | B2 | 3/2008 | Trapani et al. | |
| 7,638,796 | B2 | 12/2009 | Kwak et al. | |
| 8,390,187 | B2 * | 3/2013 | Jung et al. | 313/504 |
| 2010/0320494 | A1 * | 12/2010 | Kim et al. | 257/98 |

FOREIGN PATENT DOCUMENTS

| KR | 1020060085491 A | 7/2006 |
| KR | 1020060110127 A | 10/2006 |

OTHER PUBLICATIONS

Korean Office Action issued by KIPO, dated Mar. 1, 2011, corresponding to Korean Patent Application No. 10-2009-0131799, together with Request for Entry.

* cited by examiner

*Primary Examiner* — Britt D Hanley
(74) *Attorney, Agent, or Firm* — Robert E. Bushnell, Esq.

(57) ABSTRACT

Provided are a polarizer and an organic light-emitting display device including the same. The organic light-emitting display device may be protected by enabling the polarizer to effectively absorb external impact.

20 Claims, 2 Drawing Sheets

POLARIZER AND ORGANIC LIGHT-EMITTING DISPLAY DEVICE INCLUDING THE SAME

CLAIM OF PRIORITY

This application makes reference to, incorporates the same herein, and claims all benefits accruing under 35 U.S.C. §119 from an application earlier filed in the Korean Intellectual property Office on 28 Dec. 2009 and there duly assigned Serial No. 10-2009-0131799.

BACKGROUND OF THE INVENTION

1. Field of the Invention

The present invention relates to a polarizer and an organic light-emitting display device including the same, and more particularly, to a polarizer that may protect an organic light-emitting device from external impact, and an organic light-emitting display device including the polarizer.

2. Description of the Related Art

In general, an organic light-emitting display device, which is a self-emitting device, has advantages of having a wide viewing angle and a high contrast ratio. Because the organic light-emitting display device does not require a backlight unit, the organic light-emitting display device has advantages of having a light and thin design and low power consumption.

SUMMARY OF THE INVENTION

It is therefore an aspect of the present invention to provide an improved organic light-emitting display device in which damage due to external pressure or sudden impact is prevented.

In accordance with an aspect of the present invention, there is provided an organic light-emitting display device including a lower substrate on which an organic light-emitting device is disposed; a sealing substrate for sealing the lower substrate; and a polarizer disposed on the sealing substrate, and the polarizer including a transparent film, a retardation film, a polarizing film, a first adhesive layer disposed between the sealing substrate and the transparent film, a second adhesive layer disposed between the transparent film and the retardation film, and a third adhesive layer disposed between the retardation film and the polarizing film.

Each of at least two of the first adhesive layer, the second adhesive layer, and the third adhesive layer may have a thickness greater than 50 μm.

At least one of the first adhesive layer, the second adhesive layer, and the third adhesive layer may be a color adhesive layer that absorbs light having a specific wavelength.

The transparent film may be formed of a polymer material having a high transmittance.

The transparent film may include an optical correction material that selectively absorbs light having a specific wavelength.

The transparent film may include a color correction material.

The transparent film may be an impact-resistant film that absorbs external impact.

The retardation film may be formed by coating a liquid crystal to delay the phase of light in a specific wavelength band by $\lambda/4$ and orient liquid crystal molecules.

The polarizing film may be an iodine-based polarizing film, a dye-based polarizing film, a polyene-based polarizing film, or an iodine and dye-containing polarizing film.

The organic light-emitting display device may further include: a first substrate layer disposed between the polarizing film and the third adhesive layer; and a second substrate layer disposed on the polarizing film.

Each of the first substrate layer and the second substrate layer may include tri-acetyl-cellulose (TAC).

Hard coating or anti-reflection coating may be performed on a surface of the second substrate layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
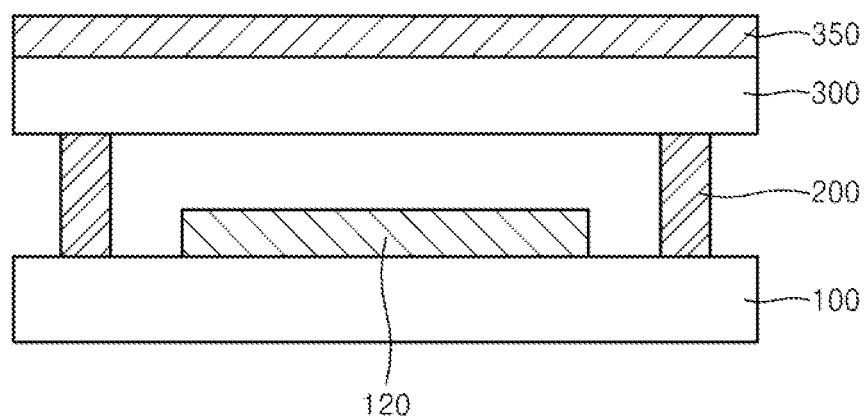
FIG. 1 is a cross-sectional view of an organic light-emitting display device constructed as an embodiment of the present invention.

The present invention will now be described more fully with reference to the accompanying drawings, in which exemplary embodiments of the invention are shown. In the drawings, the thicknesses of layers or regions are exaggerated for clarity, and like reference numerals denote like elements. While describing the present invention, detailed descriptions about related well-known functions or configurations that may blur the points of the present invention are omitted.

Unless the context dictates otherwise, the word "comprise" or variations such as "comprises" or "comprising" is understood to mean "includes, but is not limited to" such that other elements that are not explicitly mentioned may also be included.

The organic light-emitting display device has a disadvantage in that, when the organic light-emitting display device is used in sunlight, the contrast ratio of the display device is reduced. Therefore, the organic light-emitting display device may require a circular polarizer in order to increase the reduced contrast ratio under the sunlight.

In general, a circular polarizer is a film formed by sequentially attaching a retardation film, a first substrate layer, a polarizing film, and a second substrate layer to a surface of a glass substrate. The circular polarizer, however, has a disadvantage in that since the retardation film is attached to the glass substrate by using (only) a thin glass adhesive, the circular polarizer may be damaged by external pressure or sudden impact.

It is therefore an object of the present invention to provide an improved organic light-emitting display device in which damage due to external pressure or sudden impact is prevented.

Figure 2:
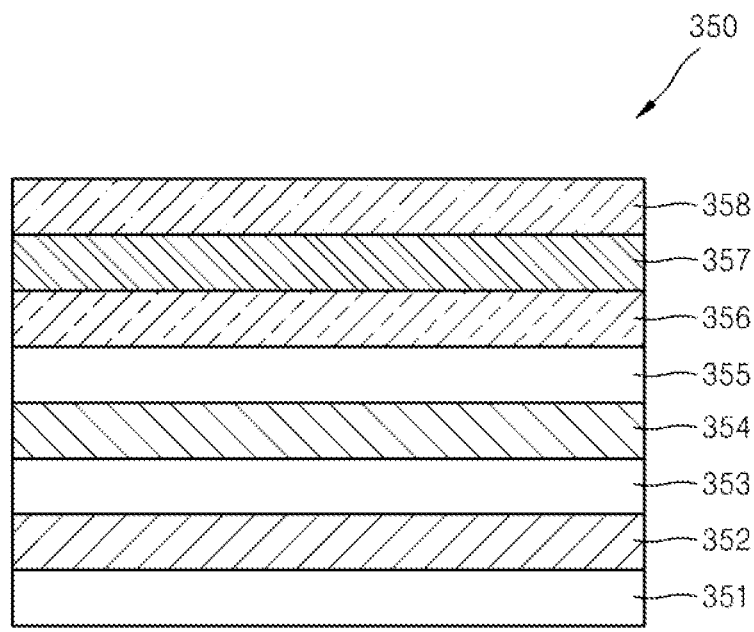
FIG. 2 is an enlarged cross-sectional view illustrating a polarizer attached to a sealing substrate of the organic light-emitting display device of FIG. 1.

FIG. 1 is a cross-sectional view of an organic light-emitting display device constructed as an embodiment of the present invention. FIG. 2 is an enlarged cross-sectional view illustrating a polarizer 350 attached to a sealing substrate 300 of the organic light-emitting display device of FIG. 1.

Referring to FIGS. 1 and 2, the organic light-emitting display device 10 includes a lower substrate 100 on which a display unit 120 is formed, the sealing substrate 300 for covering the display unit 120, and the polarizer 350 attached to the sealing substrate 300. One major surface of the polarizer 350 may face the exterior of the display device, and the other major surface of the polarizer 350 may face the interior of the display device. The lower substrate 100 and the sealing substrate 300 are adhered to each other by using a sealant 200.

The lower substrate 100 may be formed of a transparent glass material containing $SiO_2$ as a main component. The present embodiment is however not limited thereto, and the lower substrate 100 may be formed of any of various materials such as a transparent plastic material and a metal material.

If the lower substrate 100 is formed of a transparent plastic material, the transparent plastic material may be an insulating organic material selected from the group consisting of polyethersulphone (PES), polyacrylate (PAR), polyetherimide (PEI), polyethyelenen napthalate (PEN), polyethyelene-terephthalate (PET), polyphenylene sulfide (PPS), polyallylate, polyimide, polycarbonate (PC), tri-acetyl-cellulose (TAC), and cellulose acetate propionate (CAP).

If the organic light-emitting display device is a bottom-emission organic light-emitting display device for displaying an image in a direction toward the lower substrate 100, the lower substrate 100 needs to be formed of a transparent material. If the organic light-emitting display device is a top-emission organic light-emitting display device for displaying an image in a direction away from the lower substrate 100, however, it is not necessary that the lower substrate 100 is formed of a transparent material. In this case, the lower substrate 100 may be formed of a metal. If the lower substrate 100 is formed of a metal, the lower substrate 100 may include, but not limited to, at least one selected from the group consisting of carbon, iron, chromium, manganese, nickel, titanium, molybdenum, stainless steel (SUS), an Invar alloy, an Inconel alloy, and a Kovar alloy. The lower substrate 100 may be formed of a metal foil.

The lower substrate 100 on which the display unit 120 is disposed is adhered to the sealing substrate 300 disposed over the display unit 120. The sealing substrate 300 may be a glass substrate or any of various plastic substrates such as an acrylic substrate. Alternatively, the sealing substrate 300 may be formed of a metal.

The lower substrate 100 and the sealing substrate 300 are adhered to each other by using a sealant 200. The sealant 200 may be a glass frit. In one exemplary embodiment, the sealant 200 may be disposed on the periphery of the lower substrate 100. In another exemplary embodiment, the sealant 200 may be disposed on the periphery of the sealing substrate 300. The position of the sealant 200 is however not limited to the above two exemplary embodiments.

The polarizer 350 formed on the sealing substrate 300 is provided in an optical path of light emitted from the display unit 120. Of the light emitted from the display unit, the polarizer 350 transmits only light vibrating in a direction parallel to a polarizing axis and absorbs or reflects light vibrating in directions not parallel to the polarizing axis.

The polarizer 350 includes a transparent film 352, a retardation film 354, and a polarizing film 357.

The transparent film 352 is formed of a transparent material having a high transmittance for red/green/blue (R/G/B) light, for example, a transmittance greater than 80%. The transparent film 352 may be formed, but is not limited to, a polyester-based polymer such as TAC, polycarbonate, polyacrylate, polyethylene terephthalate, or polyethylene naphthalate, polysulfone, an olefin-based polymer, a norbornene-based polymer, an acrylic polymer, a styrene-based polymer, or a blend of two or three of the polymers above.

The transparent film 352 may include an optical correction material that selectively absorbs light having a specific wavelength for the purpose of RGB tuning. The optical correction material may contain at least one selected from the group consisting of $Nd_2O_3$, $Er_2O_3$, CoO, $Fe_2O_3$, $Pr_6O_{11}$, $Cr_2O_3$, and NiO. RGB tuning generally refers to an enhancement of purity of the red, green and blue light.

The transparent film 352 may include a color correction material in order to improve color purity and a bright room contrast ratio of the organic light-emitting display device. The color correction material may contain titanium (Ti), vanadium (V), chromium (Cr), manganese (Mn), iron (Fe), cobalt (Co), nickel (Ni), copper (Cu), molybdenum (Mo), ruthenium (Ru), plutonium (Pt), uranium (U), neodymium (Nd), erbium (Er), praseodymium (Pr), cerium (Ce), samarium (Sm), europium (Eu), terbium (Tb), dysprosium (Dy), holmium (Ho), thulium (Tm), silver (Ag), or cadmium (Cd).

The transparent film 352 may include an impact-resistant material for reducing external impact, for example, an acryl-based material or a silicon-based material having a high impact resistance. The transparent film 352 may have a thickness of about 150 μm so that the organic light-emitting display device may be effectively protected from external impact along with the first through third adhesive layers 351, 353 and 355.

The retardation film 354, which is a λ/4 retardation film, transforms linearly polarized light to circularly polarized light or transforms circularly polarized light into linearly polarized light by creating a quarter-wavelength (λ/4) phase shift between two polarization components that are parallel to an optical axis of the retardation film 354 and that are perpendicular to each other.

The retardation film 354 transforms light emitted from the organic light-emitting display device from circularly polarized light to linearly polarized light or from linearly polarized light to circularly polarized light.

The retardation film 354 may be formed by coating a liquid crystal to delay the phase of light in a specific wavelength band by λ/4 and orient liquid crystal molecules. The retardation film 354 may be formed of PET or TAC. The retardation film 354 may be manufactured by coating a film made of PET or TAC with an alignment layer, emitting a laser beam thereon to effect directivity on a surface of the film, coating a liquid crystal by using a coater, and drying the film coated with the liquid crystal.

The polarizing film 357 may polarize light passing through the retardation film 354 into two polarization components that are perpendicular to each other, and transmit only one of the two polarization components and absorb or diffuse the remaining polarization component.

The polarizing film 357 may be an iodine-based polarizing film, a dye-based polarizing film, a polyene-based polarizing film, or an iodine and dye-containing polarizing film. The iodine-based polarizing film may be formed of iodine ions arranged along chains of a stretched polyvinyl alcohol (PVA) film. The dye-based polarizing film may be formed of dichroic dyes arranged along chains of a stretched PVA film. The polyene-based polarizing film may be formed of polyene formed by dehydration or dehydrochlorination of a PVA film.

The polarizing film 357 may be formed by a method of heating a PVA film to stretch the PVA film and then dipping the stretched PVA film in an iodic acid and/or dichroic dye solution, a method of adsorbing an iodic acid and/or dichroic dye solution onto a PVA film and then stretching the PVA film, or a method of simultaneously performing dyeing and stretching.

The polarizing film 357 has an absorption axis and a polarization axis. The absorption axis refers to an axis in which iodine ions or dichroic dyes are arranged, and the polarization axis refers to an axis perpendicular to the absorption axis. Of two perpendicular light beams, one light beam vibrating along the absorption axis is absorbed while reacting with electrons of the polarizing film 357 to convert electric energy of light to energy of the electrons, and the remaining light beam vibrating along the polarization axis is transmitted.

The polarizing film 357, after having been subjected to stretching, tends to easily contract or bend at room temperature. To prevent the polarizing film 357 from contract and bend upon subjected to stretch, a first substrate layer 356 and a second substrate 358 are respectively disposed on both surfaces of the polarizing film 357.

The first substrate layer 356 and the second substrate layer 358 support the polarizing film 357, protect the polarizing film 357 against external impact, and enhances the durability, corrosion resistance, and mechanical strength of the polarizing film 357.

Each of the first substrate layer 356 and the second substrate layer 358 may be formed of, but is not limited to, a polyester-based polymer such as TAC, polycarbonate, polyacrylate, polyethylene terephthalate, or polyethylene naphthalate, polysulfone, an olefin-based polymer, a norbornene-based polymer, an acrylic polymer, a styrene-based polymer, or a blend of two or three of the polymers above.

Hard coating for preventing damage due to external impact or anti-reflection processing for preventing external light from being reflected may be performed on a surface of the second substrate layer 358.

A first adhesive layer 351 is disposed between the sealing substrate 300 and the transparent film 352, a second adhesive layer 353 is disposed between the transparent film 352 and the retardation film 354, and a third adhesive layer 355 is disposed between the retardation film 354 and the first substrate layer 356.

Each of the first adhesive layer 351, the second adhesive layer 353, and the third adhesive layer 355 may be formed of a pressure sensitive adhesive (PSA) to prevent changes in the optical characteristics of each adhesive layer, and each of the first adhesive layer 351, the second adhesive layer 353, and the third adhesive layer 355 do not require a high temperature process during hardening or drying. For example, the PSA may be an acrylic polymer, a silicon-based polymer, polyester, polyurethane, polyether, or a synthetic rubber.

Each of the first adhesive layer 351, the second adhesive layer 353, and the third adhesive layer 355 may use a color adhesive for absorbing light having a specific wavelength. The color adhesive may include a first dye for absorbing first light having a peak wavelength between 470 to 510 nm, a second dye for absorbing second light having a peak wavelength of 540 to 610 nm, and a binder.

The binder may include at least one selected from the group consisting of an acryl-based polymer, a silicon-based polymer, an ester-based polymer, a urethane-based polymer, an amide-based polymer, an ether-based polymer, a fluorine-based polymer, and a rubber.

The first dye may be any dye that is able to absorb the first light having the peak wavelength of 470 to 510 nm. For example, the first dye may be at least one selected from the group consisting of an anthraquinone-based dye, a methine-based dye, azomethine-based dye, oxazine-based dye, an azo-based dye, a styryl-based dye, a coumarin-based dye, a porphyrin-based dye, a dibenzofuranone-based dye, a rhodamine-based dye, a xanthene-based dye, and a pyromethine-based dye. Since the first dye absorbs the first light having the peak wavelength of 470 to 510 nm, a transmittance for the first light may be reduced below 50% and an absorbance for blue and green light may be increased.

The second dye may be any dye that is able to absorb the second light having the peak wavelength of 540 to 610 nm. For example, the second dye may be at least one selected from the group consisting of an anthraquinone-based dye, a methine-based dye, azomethine-based dye, oxazine-based dye, an azo-based dye, a styryl-based dye, a coumarin-based dye, a porphyrin-based dye, a debenzofuranone-based dye, a rhodamine-based dye, a xanthene-based dye, and a pylomethine-based dye. Since the second dye absorbs the second light having the peak wavelength of 540 to 610 nm, a transmittance for the second light may be reduced below 50% and an absorbance for green and red light may be increased.

When a transmittance for the first and second light is less than 50% and an absorptance for the first and second light is greater than 50%, power reduction of an organic light-emitting device may be prevented.

Materials and concentrations of the first dye, the second dye, and the binder of the color adhesive are however not limited by light absorbed by the color adhesive.

Since the color adhesive includes both the first dye and the second dye to respectively absorb the first light having the peak wavelength of 470 to 510 nm and the second light having the peak wavelength of 540 to 610 nm, intensity at an intersection between a blue peak wavelength and a green peak wavelength and intensity at an intersection between a green peak wavelength and a red peak wavelength may be reduced and the color purity and color reproduction of the organic light-emitting device may be improved.

Each of at least two of the first adhesive layer 351, the second adhesive layer 353, and the third adhesive layer 355 may have a thickness greater than 50 μm, so that a total thickness of the first through third adhesive layers 351, 353, and 355 is greater than 100 μm. The first through third adhesive layers 351, 353 and 355 have a total thickness greater than 150 μm when each of layers 351, 353 and 355 may have 50 μm.

Since the first through third adhesive layers 351, 353, and 355 have a total thickness greater than 100 μm, and the first adhesive layer 351 attaches the transparent film 352 to the sealing substrate 300, the second adhesive layer 353 attaches the retardation film 354 to the transparent film 352, and the third adhesive layer 355 attaches the first substrate layer 356 to the retardation film 354, the corrosion resistance of the polarizer 350 may be enhanced and the polarizer 350 may be protected from external impact due to the constant elasticity of the first through third adhesive layers 341, 353, and 355.

Since the polarizer 350 includes the transparent film 352 and the first through third adhesive layers 351, 353, and 355 wherein each of at least two of the first through third adhesive layers 351, 353, and 355 has a thickness greater than 50 μm and the first through third adhesive layers 351, 353, and 355 have a total thickness greater than 100 μm, sudden external impact which is locally applied to the polarizer 350 may be distributed over the first through third adhesive layers 351, 353, and 355, which may be relatively thick and soft, thereby making it possible for the organic light-emitting display device to have a high mechanical strength.

Figure 3:
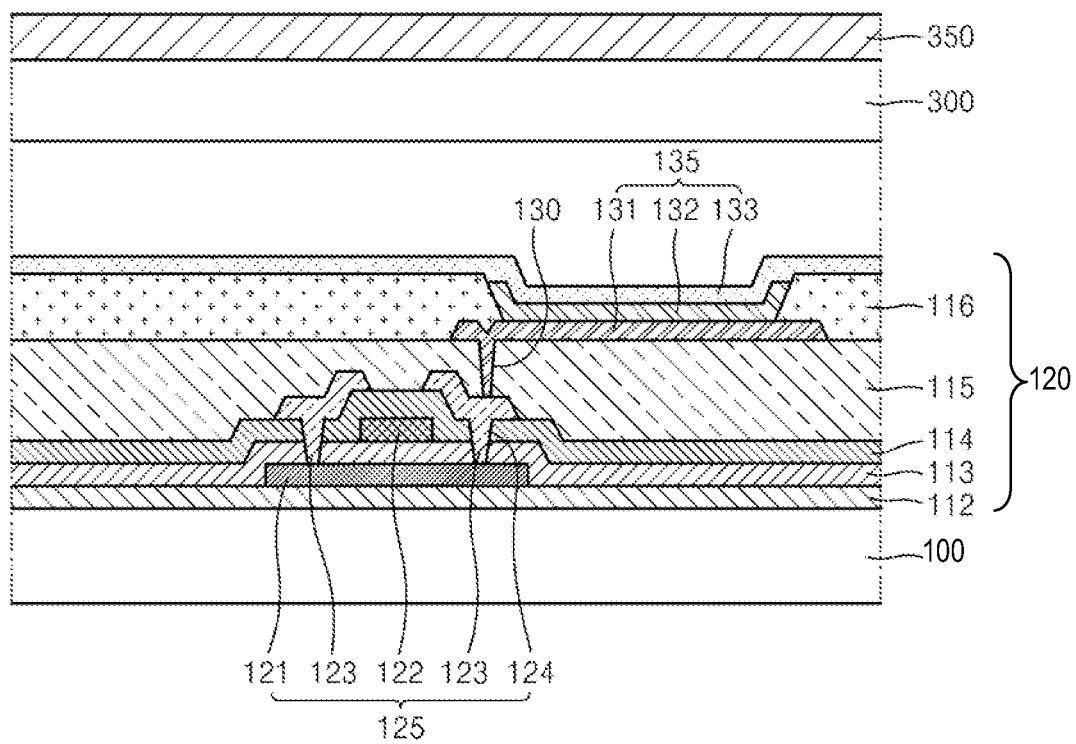
FIG. 3 is a cross-sectional view illustrating a display unit of the organic light-emitting display device of FIG. 1.

FIG. 3 is a cross-sectional view illustrating the display unit 120 of the organic light-emitting display device of FIG. 1.

Referring to FIG. 3, the display unit 120 disposed on the lower substrate 100 may include a plurality of organic thin film transistors (TFTs) 125 and organic light-emitting devices 135. FIG. 3 illustrates one TFT and one organic light-emitting device for convenience of explanation.

An insulating layer 112 as a barrier layer and/or as a buffer layer for preventing diffusion of impurity ions and penetration of moisture or external air and for planarizing a top surface of the lower substrate 120 may be formed on the top surface of the lower substrate 120.

Each of the plurality of TFTs 125 is formed as a driving circuit on the insulating layer 112. Although the TFT 125 is a top gate TFT in FIG. 3, the present embodiment is not limited thereto, and other TFTs may be used.

An activation layer 121 formed of a semiconductor material is formed on the insulating layer 112, and a gate insulating layer 113 is formed to cover the activation layer 121. The activation layer 121 may be formed of an inorganic semiconductor material, such as amorphous silicon or polysilicon, or an organic semiconductor material. The activation layer 121 has a source region, a drain region, and a channel region formed between the source region and the drain region.

A gate electrode 122 is disposed on the gate insulating layer 113, and an inter-layer insulating layer 114 is formed to cover the gate electrode 122. Source and drain electrodes 123 are disposed on the inter-layer insulating layer 114, and a planarization layer 115 is disposed to cover the source and drain electrodes 123.

The present embodiment is not limited to the TFT 125 constructed as described above, and the TFT 125 may have any of other various configurations.

A first electrode 131 of the OLED 135 is formed on the planarization layer 115 and is electrically connected to one of the source and drain electrodes 123 through a contact hole 130.

A second electrode 133 is disposed over the first electrode 131 to face the first electrode 131.

The first electrode 131 may be an anode electrode and the second electrode 133 may be a cathode electrode, or vise versa.

The first electrode 131 may be a transparent electrode or a reflective electrode. If the first electrode 131 is a transparent electrode, the first electrode 131 may be formed of indium tin oxide (ITO), indium zinc oxide (IZO), zinc oxide (ZnO), or indium oxide ($In_2O_3$). If the first electrode 131 is a reflective electrode, the first electrode 131 may include a reflective layer formed of silver (Ag), magnesium (Mg), aluminum (Al), plutonium (Pt), palladium (Pd), gold (Au), nickel (Ni), neodymium (Nd), iridium (Ir), chromium (Cr), or a combination thereof, and a transparent layer formed of ITO, IZO, ZnO, or In2O3.

The second electrode 133 may be a transparent electrode or a reflective electrode. If the second electrode 133 is a transparent electrode, the second electrode 133 may include a predetermined layer formed by depositing lithium (Li), calcium (Ca), lithium fluoride/calcium (LiF/Ca), lithium fluoride/aluminum (LiF/Al), aluminum (Al), magnesium (Mg), or a compound thereof to face an intermediate layer between the first electrode 131 and the second electrode 133, and an auxiliary electrode or bus electrode line formed of a transparent conductive material such as ITO, IZO, ZnO, or $In_2O_3$ and disposed on the predetermined layer.

When the display unit 120 includes the TFT 125 as described above, the first electrode 131 is electrically connected to a TFT that is formed at each of sub pixels. The pixel definition layer 116 is formed on the planarization layer 115 and exposes a part of the first electrode 131. The second electrode may be a common electrode connected to all of the sub pixels. If the display unit 120 includes no TFT at each of the sub pixels, the first electrode 130 and the second electrode 133 may be patterned in stripes to cross each other and may be driven in a passive matrix (PM) manner. The pixel definition layer 116 electrically insulates the neighboring OLEDs from each other.

An organic layer 132 is disposed between the first electrode 131 and the second electrode 133.

The organic layer 132 may be formed of a low or high molecular weight organic material. If the organic layer 132 is formed of a low molecular weight organic material, the organic layer 132 may be formed by stacking a hole injection layer (HIL), a hole transport layer (HTL), an organic emission layer (EML), an electron transport layer (ETL), and an electron injection layer (EIL) each as a single or multi-layer structure. Examples of the low molecular weight organic material may include copper phthalocyanine (CuPc), N, N'-Di(naphthalene-1-yl)-N, N'-diphenyl-benzidine (NPB), and tris-8-hydroxyquinoline aluminum (Alq3). The low molecular weight organic materials may be deposited by vacuum deposition using masks.

If the organic layer 132 is formed of a high molecular weight organic material, the organic layer 132 may include an HTL and an EML. The HTL may be formed of poly-(2,4)-ethylene-dihydroxy thiophene (PEDOT), and the EML may be formed of a high molecular weight organic material such as poly-phenylenevinylene (PPV) or polyfluorene.

The sealing substrate 300 seals the lower substrate 100 by using the sealant 200. The sealing substrate 300 may be formed of any of various materials, for example, a glass material or a plastic material, as described above.

The polarizer 350 is disposed on the sealing substrate 300. The polarizer 350 includes the transparent film 352 having a high transmittance, the retardation film 354, and the polarizing film 357. The first through third adhesive layers 351, 353, and 355 are respectively disposed between the sealing substrate 300 and the transparent film 352, between the transparent film 352 and the retardation film 354, and between the retardation film 354 and the polarizing film 357. The first and second substrate layers 356 and 358 may be formed over and under the polarizing film 357.

At least one of the first through third adhesive layers 351, 353, and 355 may be formed by using a color adhesive that absorbs light having a specific wavelength, and each of at least two of the first through third adhesive layers 351, 353, and 355 may have a thickness of 50 μm. Since the first through third adhesive layers 351, 353, and 355 have a total thickness greater than 100 μm, the organic light-emitting display device may be effectively protected from external impact.

In one embodiment, the polarizer 350 may be disposed immediately on the sealing substrate 300, and at least one major surface of the polarizer 350 faces the exterior of the display device 10. The polarizer 350 may include a transparent film 352, a retardation film 354, a polarizing film 357, a first adhesive layer 351 disposed immediately between the sealing substrate 300 and the transparent film 352, a second adhesive layer 353 disposed immediately between the transparent film 352 and the retardation film 354, and a third adhesive layer 355 disposed between the retardation film 354 and the polarizing film 357. A first substrate layer 356 may be disposed immediately between the polarizing film 357 and the third adhesive layer 355; and a second substrate layer 358 may be immediately disposed on the polarizing film 357.

As described above, in accordance with the present invention, an organic light-emitting display device may be protected by enabling a polarizer to effectively absorb external impact.

Furthermore, problems, such as poor cutting, adhesive leakage, and deformation, caused by a single adhesive layer may be avoided by forming a plurality of adhesive layers and thus making the polarizer relatively thick, thereby improving productivity.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. An organic light-emitting display device, comprising:
    a lower substrate on which an organic light-emitting device is disposed;
    a sealing substrate for sealing the lower substrate; and
    a polarizer disposed on the sealing substrate, and the polarizer comprising a transparent film, a retardation film, a polarizing film, a first adhesive layer disposed between the sealing substrate and the transparent film, a second adhesive layer disposed between the transparent film and the retardation film, and a third adhesive layer disposed between the retardation film and the polarizing film.

2. The organic light-emitting display device of claim 1, wherein each of at least two of the first adhesive layer, the second adhesive layer, and the third adhesive layer has a thickness greater than 50 μm.

3. The organic light-emitting display device of claim 1, wherein at least one of the first adhesive layer, the second adhesive layer, and the third adhesive layer is a color adhesive layer that absorbs light having a specific wavelength.

4. The organic light-emitting display device of claim 1, wherein the transparent film is formed of a polymer material having a high transmittance.

5. The organic light-emitting display device of claim 1, wherein the transparent film comprises an optical correction material that selectively absorbs light having a specific wavelength.

6. The organic light-emitting display device of claim 1, wherein the transparent film comprises a color correction material.

7. The organic light-emitting display device of claim 1, wherein the transparent film is an impact-resistant film that absorbs external impact.

8. The organic light-emitting display device of claim 1, wherein the retardation film is formed by coating a liquid crystal to delay a phase of light in a specific wavelength band by λ/4 and orient liquid crystal molecules.

9. The organic light-emitting display device of claim 1, wherein the polarizing film is an iodine-based polarizing film, a dye-based polarizing film, a polyene-based polarizing film, or an iodine and dye-containing polarizing film.

10. The organic light-emitting display device of claim 1, further comprising:
    a first substrate layer disposed between the polarizing film and the third adhesive layer; and
    a second substrate layer disposed on the polarizing film.

11. The organic light-emitting display device of claim 10, wherein each of the first substrate layer and the second substrate layer comprises tri-acetyl-cellulose (TAC).

12. The organic light-emitting display device of claim 10, wherein hard coating or anti-reflection coating is performed on a surface of the second substrate layer.

13. A polarizer, comprising:
    a transparent film having a high transmittance of light;
    a retardation film disposed on the transparent film;
    a polarizing film disposed on the retardation film; and
    an adhesive film comprising a first adhesive layer disposed between a sealing substrate for sealing an organic light-emitting device and the transparent film, a second adhesive layer disposed between the transparent film and the retardation film, and a third adhesive layer disposed between the retardation film and the polarizing film.

14. The polarizer of claim 13, wherein each of at least two of the first adhesive layer, the second adhesive layer, and the third adhesive layer has a thickness greater than 50 μm.

15. The polarizer of claim 13, wherein at least one of the first adhesive layer, the second adhesive layer, and the third adhesive layer is a color adhesive layer that absorbs light having a specific wavelength.

16. The polarizer of claim 13, wherein the transparent film is formed of a polymer material having a high transmittance.

17. The polarizer of claim 13, wherein the transparent film comprises an optical correction material that selectively absorbs light having a specific wavelength.

18. The polarizer of claim 13, wherein the transparent film comprises a color correction material.

19. The polarizer of claim 13, wherein the transparent film is an impact-resistant film that absorbs external impact.

20. The polarizer of claim 13, further comprising:
    a first substrate layer disposed between the polarizing film and the third adhesive layer; and
    a second substrate layer disposed on the polarizing film.

* * * * *